US010285313B2

(12) United States Patent
Murase et al.

(10) Patent No.: US 10,285,313 B2
(45) Date of Patent: May 7, 2019

(54) FEEDER DEVICE

(71) Applicant: FUJI CORPORATION, Chiryu-shi (JP)

(72) Inventors: Hiroki Murase, Nagoya (JP); Hiroyasu Ohashi, Toyota (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/541,907

(22) PCT Filed: Jan. 22, 2015

(86) PCT No.: PCT/JP2015/051701
§ 371 (c)(1),
(2) Date: Jul. 6, 2017

(87) PCT Pub. No.: WO2016/117091
PCT Pub. Date: Jul. 28, 2016

(65) Prior Publication Data
US 2018/0007820 A1      Jan. 4, 2018

(51) Int. Cl.
*H05K 13/02*       (2006.01)
*H05K 13/04*       (2006.01)
(Continued)

(52) U.S. Cl.
CPC ............. *H05K 13/02* (2013.01); *B32B 38/10* (2013.01); *B32B 43/006* (2013.01);
(Continued)

(58) Field of Classification Search
CPC .......... H05K 13/0417; H05K 13/0408; H05K 13/021; H05K 13/0419
See application file for complete search history.

(56) References Cited

U.S. PATENT DOCUMENTS 6,699,355 B2 *   3/2004   Yman ................... H05K 13/02
                                                     156/701
7,713,376 B2 *   5/2010   Larsson ............... H05K 13/021
                                                     156/65
(Continued)

FOREIGN PATENT DOCUMENTS

DE         32 14 600 A1     10/1983
EP         1 530 414 A1      5/2005
(Continued)

OTHER PUBLICATIONS

International Search Report dated Feb. 24, 2015 in PCT/JP2015/51701 filed Jan. 22, 2015.
(Continued)

*Primary Examiner* — Mark A Osele
(74) *Attorney, Agent, or Firm* — Oblon, McClelland, Maier & Neustadt, L.L.P.

(57) ABSTRACT

The present invention includes a tape peeling mechanism provided with a peeling member configured to enter a leading end surface in a feeding direction of fed component supply tape made from carrier tape and cover tape so as to peel the cover tape from the carrier tape, enabling a component to be supplied from at a component supply position, wherein the peeling member is displaced upwards after entering the leading end surface of the carrier tape as the component supply tape is fed. Accordingly, cover tape is reliably peeled without damaging components, and changeover work on the leading end of the component supply tape is not required.

6 Claims, 10 Drawing Sheets

(51) Int. Cl.
    *B32B 38/10* (2006.01)
    *B32B 43/00* (2006.01)
(52) U.S. Cl.
    CPC ....... *H05K 13/021* (2013.01); *H05K 13/0419* (2018.08); *B32B 2405/00* (2013.01); *B65H 2701/1942* (2013.01)

(56) References Cited

U.S. PATENT DOCUMENTS

| | | | | |
|---|---|---|---|---|
| 8,544,652 | B2* | 10/2013 | Davis | B65D 75/327 |
| | | | | 156/750 |
| 8,678,065 | B2* | 3/2014 | Hwang | H05K 13/0417 |
| | | | | 156/764 |
| 9,674,995 | B2* | 6/2017 | Yanagida | H05K 13/02 |
| 2010/0186901 | A1 | 7/2010 | Ikeda et al. | |
| 2010/0239401 | A1 | 9/2010 | Kim | |
| 2014/0318713 | A1* | 10/2014 | Wiley | B32B 43/006 |
| | | | | 156/701 |
| 2017/0251578 | A1* | 8/2017 | Takata | H05K 13/0417 |

FOREIGN PATENT DOCUMENTS

| | | |
|---|---|---|
| EP | 2 903 405 A1 | 8/2015 |
| JP | 2010-3714 A | 1/2010 |
| JP | 2010-199567 A | 9/2010 |
| JP | 2011-29260 A | 2/2011 |
| JP | 2014-154691 A | 8/2014 |
| WO | WO 2014050209 A1 * 4/2014 ......... H05K 13/0417 |

OTHER PUBLICATIONS

Extended Search Report dated Dec. 22, 2017 in European Patent Application No. 15878784.6.

* cited by examiner

FEEDER DEVICE

TECHNICAL FIELD

The present application relates to a feeder device for a component mounter, specifically, to a tape peeling mechanism that peels cover tape from carrier tape that stores components.

BACKGROUND ART

Equipment such as solder printers, component mounters, reflow ovens, and board inspection machines is used to produce boards mounted with many components. Conventionally, this equipment is connected to form a board production line. Among this equipment, there are component mounters provided with a board conveyance device, a component supply device, a component transfer device, and a control device. A typical example of a component supply device is a feeder device that feeds component supply tape in which many components are stored at a specified pitch. Component supply tape is formed from carrier tape in which components are stored in many component storage sections, and cover tape attached to the top surface of the carrier tape so that the components do not fall out. Therefore, feeder devices are provided with at least one of a tape peeling mechanism that peels cover tape from carrier tape, and a tape cutting mechanism that cuts the cover tape to open the component storages sections. Technology related to this type of feeder device is disclosed in PTL 1.

An electronic component supply device of PTL 1 has an electronic component exposing device that exposes a component in a component storage section arranged between first and second feeding devices that feed the component storage tape (component supply tape). Further, the electronic component exposing device is provided with a cutting device that cuts the cover tape along the feeding direction, an opening device that opens the cut cover tape, and a protruding section that guides the cover tape to the cutting device. Accordingly, it is possible to supply components without separating the cover tape from the carrier tape, and it is possible to realize an electronic component supply device that causes few components to be damaged or lost.

CITATION LIST

Patent Literature

PTL 1: JP-A-2011-29260

SUMMARY

Problem to be Solved

However, with PTL 1, the protruding section arranged at the front of the cutting device makes cutting easier by prising the cover tape from the carrier tape and widening a gap between the two. However, there is no guarantee that the protruding section will smoothly enter and proceed between the cover tape and the carrier tape when the leading end of the component supply tape arrives at the protruding section. If the protruding section is positioned higher than the cover tape, the body of the component storage tape will go under the protruding section and components will not longer be able to be supplied. On the other hand, if the protruding section strikes the carrier tape, the carrier tape may be ripped and the components damaged.

As a countermeasure to this, in an embodiment of PTL 1, a notch is made in advance in the lengthwise direction of the leading end of the cover tape such that the protruding section easily enters between the cover tape and the carrier tape. Also, with a feeder device that only performs peeling and is not provided with a cutting device, a portion near the leading end of the cover tape is peeled in advance to facilitate the entering of the protruding section. However, work of making a notch in cover tape or peeling cover tape in advance must be performed each time a reel wound with component supply tape is exchanged, which is troublesome.

The present application takes account of such problems with the above background art, and an object thereof is to provide a feeder device that reliably peels cover tape without damaging components and without requiring work on a leading end of component supply tape.

Means for Solving the Problem

A tape feeding mechanism configured to feed component supply tape made from carrier tape that stores components respectively in many component storage sections formed in a lengthwise direction of the tape and cover tape attached to a specified attachment section on an upper surface of the carrier tape that prevents the components from falling from the component storage sections; and a tape peeling mechanism provided with a peeling member configured to enter a leading end surface in a feeding direction of the fed component supply tape so as to peel the cover tape from the carrier tape as the component supply tape is fed thereby enabling the component to be supplied from the component storage section of the carrier tape at a component supply position, wherein the peeling member is displaced upwards after entering the leading end surface of the carrier tape as the component supply tape is fed.

Advantageous Effects

The peeling member enters the leading end surface of the carrier tape on the side of the component supply tape when the leading end surface of the fed component supply tape arrives. Therefore, a problem of the overall body of the component supply tape going under the peeling member does not occur. Also, the peeling member, after entering the leading end surface of the carrier tape, is displaced upwards as the component supply tape is fed, and naturally rises to the upper surface of the carrier tape. Therefore, the peeling member settles between the carrier tape and the cover tape and components in the component storage sections are not damaged. Further, because the peeling member subsequently progresses between the carrier tape and cover tape, the cover tape can be peeled reliably. Also, conventional work of making a notch in the cover tape near the leading end of the component supply tape and of peeling the cover tape in advance is not required.

DESCRIPTION OF EMBODIMENTS

1. Overall Configuration of Component Mounter 9

Figure 1:
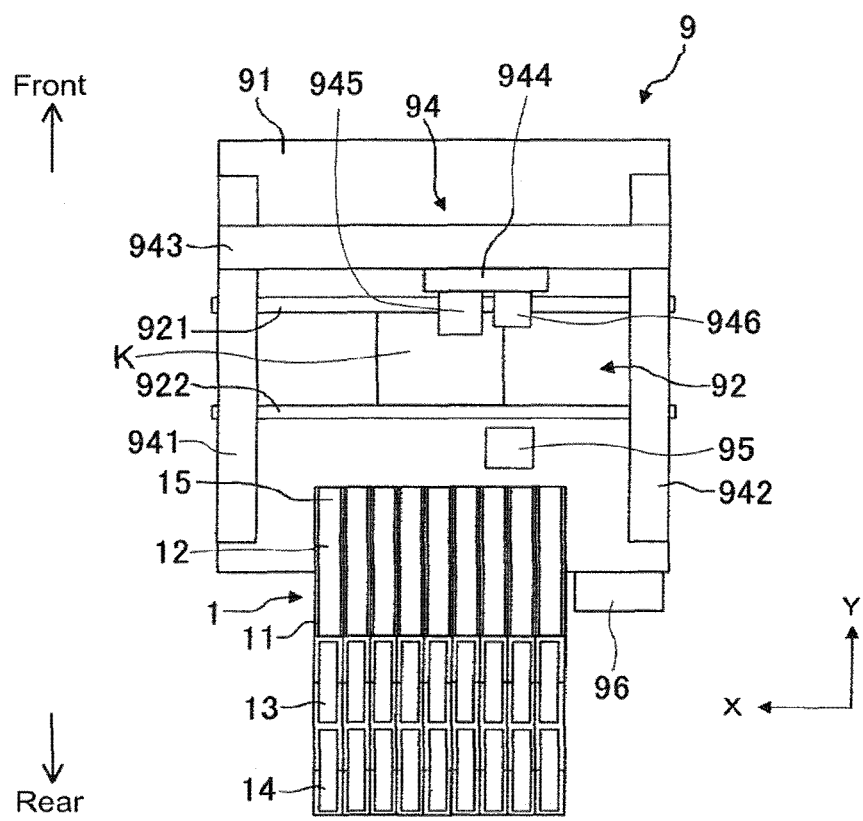
FIG. 1 is a plan view showing the overall configuration of a component mounter provided with an embodiment of a feeder device.

First, the overall configuration of component mounter 9 provided with an embodiment of the present application, feeder device 1, is described with reference to FIG. 1. FIG. 1 is a plan view showing the overall configuration of component mounter 9 provided with an embodiment, feeder device 1. The direction from the right side of the page to the left side in FIG. 1 is the X-axis direction, in which board K is conveyed, the direction from the rear at the bottom of the page to the front at the top of the page in the Y-axis direction, and the perpendicular vertical direction (coming out from the page) is the Z-axis direction. Component mounter 9 is configured from board conveyance device 92, multiple feeder devices component transfer device 94, component camera 95, and control device 96 assembled on base 91. Board conveyance device 92, feeder devices 1, component transfer device 94, and component camera 95 are controlled from control device 96 such that each performs specified work.

Board conveyance device 92 loads board K to a mounting position, fixes board K in position, and unloads board K. Board conveyance device 92 is configured from items such as first and second guide rails 921 and 922, a pair of conveyor belts, and a clamping device. First and second guide rails 921 and 922 extend in the conveyance direction (X-axis direction) crossing the central upper surface of base 91, and are assembled on base 91 so as to be parallel to each other. A pair of endless conveyor belts, which are not shown, are arranged facing each other on the inside of first and second guide rails 921 and 922. The pair of conveyor belts revolve with both edges of board K in contact with the conveyance surface of the conveyor belts and load/unload board K to/from a mounting position set in a center section of base 91. A clamping device, which is not shown, provided below the conveyor belts at the mounting position. The clamping device pushes up board K and clamps it in a horizontal state so as to fix it at the mounting position. This allows component transfer device 94 to perform mounting operation at the mounting position.

The multiple feeder devices 1 each consecutively supply components P. The multiple feeder devices 1 are box-shaped with a small width direction and are provided lined up in the width direction (X-axis direction) on the upper surface of pallet member 11 on base 91. Each feeder device 1 includes items such as main body section 12, two supply reels 13 and 14 provided on the rear section of main body section 12, and component supply position provided on an upper section near the front of main body section 12. Component supply tape 8 (refer to FIGS. 2 and 3) is wound on each supply reel 13 and 14. Component supply tape 8 is fed at a specified pitch each time such that components P are revealed from their stored state and supplied consecutively to component supply position 15. Note that, a portion of the multiple feeder devices 1 may be replaced with a component supply device of a different type, for example, a tray type component supply device. Detailed configurations of component supply tape 8 and feeder device 1 are described later.

Component transfer device 94 picks up a component from component supply position 15 of each feeder device 1, moves the component to board K held at a fixed position and mounts the component on the board K. Component transfer device 94 is an XY robot type device that is capable of moving horizontally in the X-axis direction and the Y-axis direction. Component transfer device 94 is configured from pair of Y-axis rails 941 and 942, Y-axis slider 943, mounting head 944, nozzle tool 945, board camera 946, and the like. The pair of Y-axis rails 941 and 942 are provided at the edges of base 91 and extend in the front-rear direction of base 91 (the Y-axis direction). Y-axis slider 943 is mounted on Y-axis rails 941 and 942 so as to be movable in the Y-axis direction.

Mounting head 944 is mounted on Y-axis slider 943 so as to be movable in the X-axis direction. Mounting head 944 is moved in the X-axis direction and Y-axis direction by two sets of ball screw mechanisms. Nozzle tool 945 is exchangeably held on mounting head 944. Nozzle tool 945 has one or multiple suction nozzles that pick up a component and mount the component on board K. Board camera 946 is provided on mounting head 944 alongside nozzle tool 945. Board camera 946 images fiducial marks provided on board K to detect an accurate position of board K.

Component camera 95 is provided facing upwards on an upper surface of base 91 between board conveyance device 92 and feeder device 1. Component camera 95 images a state of a component picked up by a suction nozzle as the component is moved from feeder device 1 to above board K by mounting head 944. When items such as deviations in the pickup position and rotation and so on of the component are understood from the image data of component camera 95, control device 96 performs fine adjustments of component mounting operation as necessary, and performs control to reject components for which mounting is difficult.

Control device 96 stores a mounting sequence that defines the order and types of components to be mounted on board K and the feeder devices 1 that supply the electronic components. Control device 96 controls component mounting operation in accordance with the mounting sequence based on items such as image data of board camera 946 and component camera 95 and detection data of sensors, which are not shown. Also, control device 96 sequentially collects and updates operating data such as production quantity of completed boards K, mounting time required to mount the components, and occurrences of component pickup errors.

2. Configuration of Component Supply Tape 8

Figure 2:
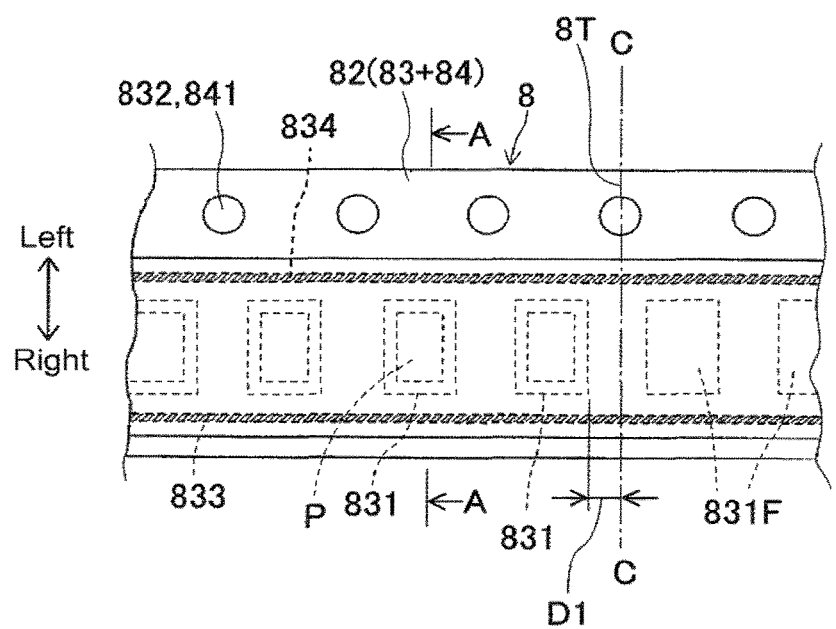
FIG. 2 is a plan view showing a portion including a leading end surface in the feeding direction of component supply tape.
Figure 3:
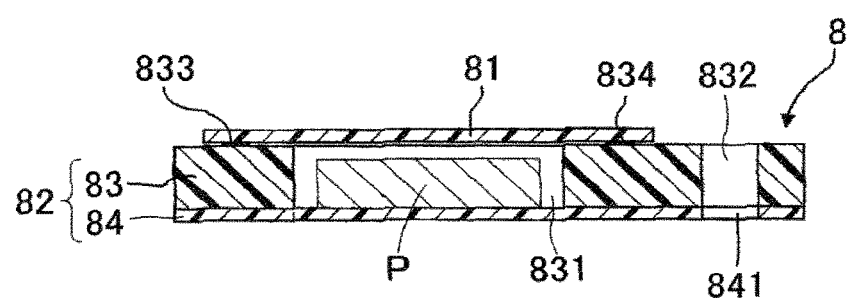
FIG. 3 is a cross section along the view A-A from FIG. 2 showing a component stored in the component supply tape.

The detailed configuration of component supply tape 8 to be fed that is wound on supply reels 13 and 14 will be described with reference to FIGS. 2 and 3. FIG. 2 is a plan view showing a portion including leading end surface 8T in the feeding direction of component supply tape 9. Also, FIG. 3 is a cross section along the view A-A from FIG. 2 showing a component stored P in component supply tape 8. As shown in FIGS. 2 and 3, component supply tape 8 is made from cover tape 81 and carrier tape 82. Carrier tape 82 is formed with bottom tape 84 affixed to the lower side of base tape 83.

Base tape 83 is formed of a flexible material such as paper or resin. Many rectangular component storage sections 831F and 831 are formed at a regular pitch in the tape lengthwise direction positioned slightly to the right of the center in the tape width direction of base tape 83. No component P is stored in the few component storage sections 831F at the leading end of the tape. After those few, a component P is stored in each of the component storage sections 831. Multiple engaging holes 832 are provided parallel to an edge of the tape at a regular pitch in the tape lengthwise direction positioned towards the right edge of base tape 83.

Bottom tape 84 is affixed to a lower surface of base tape 83. Bottom tape 84 is formed from a thin, transparent, polymer film. Bottom tape 84 has a width dimension that matches the width dimension of base tape 83. Engaging holes 841 are formed in bottom tape 84 to match engaging holes 832 of base tape 83.

Cover tape 81 is peelably attached to an upper surface of base tape 83. In detail, attachment section 833 is provided in a tape lengthwise direction on an upper surface between component storage section 831 and the right edge of base tape 83. And, attachment section 834 is provided in a tape lengthwise direction on an upper surface between component storage section 831 and engagement holes 832 of base tape 83. A portion near the edges of cover tape 81 is attached to the two attachment sections 833 and 834. Cover tape 81 is formed from a thin, transparent, polymer film. Cover tape has a width dimension smaller than that of base tape 83, and covers component storage section 831, but does not cover engaging holes 832 or 841. According to the above configuration, a component P is stored in each component storage section 831 of base tape 83 and prevented from falling out by bottom tape 84 and cover tape 81.

Component supply tape 8 is cut before use along cutting line C-C of FIG. 2, such that component storage sections 831F not storing a component P are removed. The end surface of the cut component supply tape 8 is leading end surface 8T in the feeding direction. Leading end surface 8T is fed towards tape peeling mechanism 5, which is described later. Also, the distance between leading end surface 8T and the first component storage section 831 in which a component P is stored is distance D1.

3. Configuration of Feeder Device 1 of an Embodiment

Figure 4:
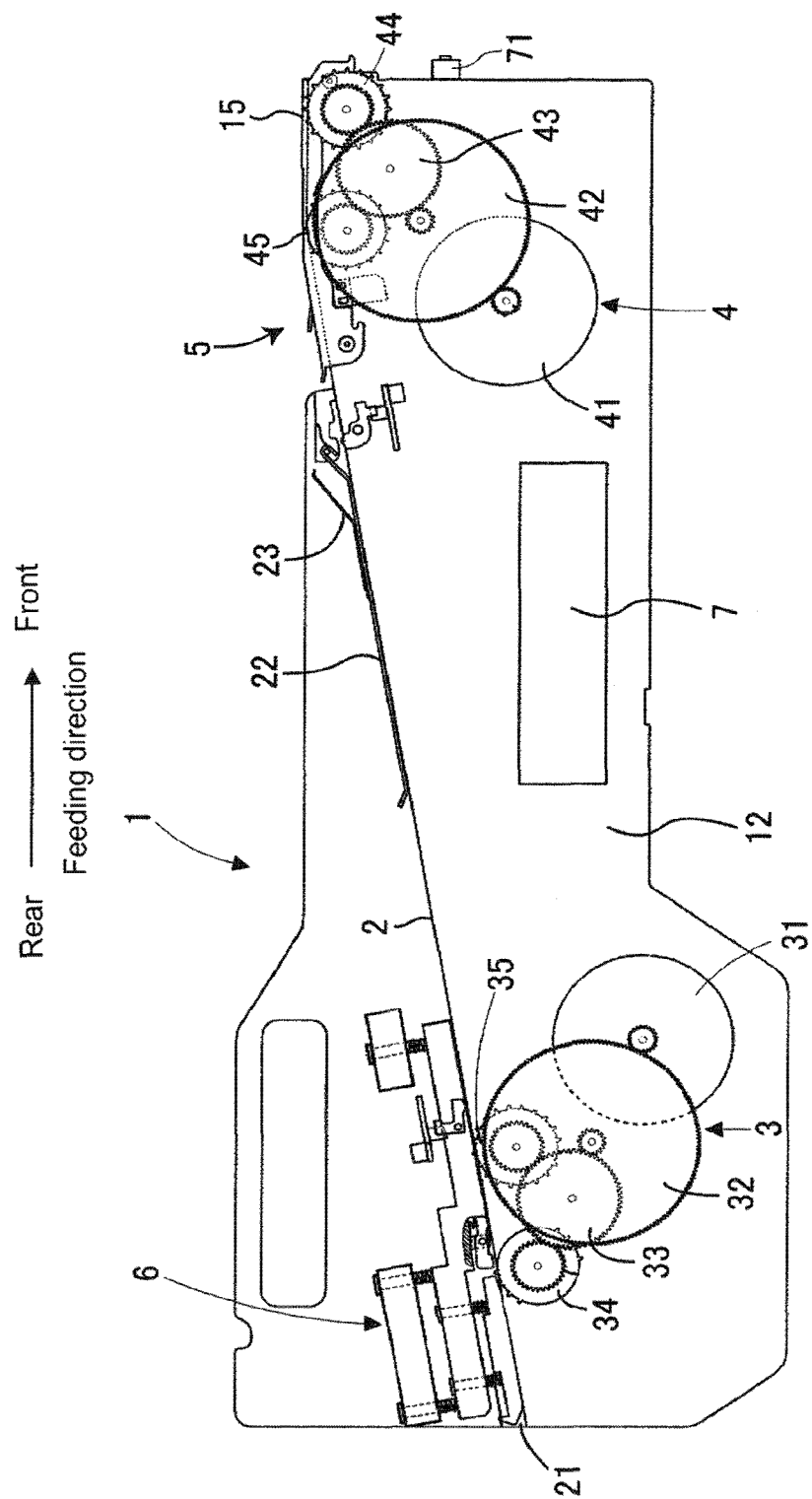
FIG. 4 is a side view showing the detailed configuration of a feeder device of an embodiment.

Next, the detailed configuration of feeder device 1 will be described with reference to FIG. 4. FIG. 4 is a side view showing the detailed configuration of feeder device 1 of an embodiment. Feeder device 1 is configured from items such as rail 2, rear side tape feeding mechanism 3, front side tape feeding mechanism 4, tape peeling mechanism 5, next tape control mechanism 6, and control section 7 assembled on two side plates that form main body section 12. The two side plates that form main body section 12 are arranged parallel separated by the width of the box shape, and the side plate facing the reader in FIG. 4 is not shown.

Rail 2 is a member for guiding the feeding of component supply tape 8 on an upper surface thereof. Rail 2 is formed of a long thin member slightly wider than the tape width of component supply tape 8. Rail 2 is arranged inclined from a roughly central height at the rear of main body section 12 to an upper portion at the front of main body section 12. Insertion opening 21 formed at an upper side at the rear end of rail 2 is formed such that two component supply tapes 8 pulled from supply reels 13 and 14 can be inserted overlapping. Lifting prevention member 22 is provided near a central portion in the lengthwise direction of rail 2. Lifting prevention member 22 presses the upper surface of rail 2 via torsion spring 23. Lifting prevention member 22 sandwiches component supply tape against rail 2 such that the component supply tape 8 can be fed while preventing the component supply tape 8 from lifting. Component supply position 15 is provided on an upper surface near the front end of rail 2. Note that, a guide member, which is not shown, that supports component supply tape 8 in a width direction is provided going up from both edges of rail 2.

Rear side tape feeding mechanism 3 is provided on a lower section towards the rear of rail 2. Rear side tape feeding mechanism 3 is configured from items such as first motor 31, first gear 32, second gear 33, first sprocket 34, and second sprocket 35. An output shaft of first motor 31 is rotatably connected to first sprocket 34 and second sprocket 35 via first gear 32 and second gear 33 by way of gear coupling. Output teeth of first sprocket 34 and second sprocket 35 protrude upwards from a gap formed in rail 2 to engage with engaging holes 832 and 841 of component supply tape 8. Accordingly, when motor 31 rotates intermittently by a fixed rotation amount each time, rear side tape feeding mechanism 3 feeds component supply tape 8 by a fixed pitch each time forwards along an upper surface of rail 2.

Front side tape feeding mechanism 4 is provided on a lower section towards the front of rail 2. Front side tape feeding mechanism 4 is configured from items such as second motor 41, third gear 42, fourth gear 43, third sprocket 44, and fourth sprocket 45. An output shaft of second motor 31 is rotatably connected to third sprocket 44 and fourth sprocket 45 via third gear 42 and fourth gear 43 by way of gear coupling. Output teeth of third sprocket 44 and fourth sprocket 45 protrude upwards from a gap formed in rail 2 to engage with engaging holes 832 and 841 of component supply tape 8. Accordingly, in synchronization with first motor 31, when second motor 41 rotates intermittently by a fixed rotation amount each time, front side tape feeding mechanism 4 feeds component supply tape 8 by a fixed pitch each time forwards along an upper surface of rail 2.

Next tape control mechanism 6 is provided on an upper section towards the rear of rail 2, that is, on an upper side of rear side tape feeding mechanism 3. Next tape control mechanism 6 controls feeding of two component supply tapes inserted overlapping into inspection opening 21 from two supply reels 13 and 14. That is, next tape control mechanism 6 allows the feeding of a first component supply tape 8 that is currently in use, and holds the leading end of a second component supply tape 8 to be used next. And, next tape control mechanism 6 automatically starts feeding of the second component supply tape 8 when the first component supply tape 8 runs out, and allows the insertion of a third component supply tape 8

Control section 7 is provided towards the bottom of main body section 12. Control section 7 is provided with items such as a microprocessor, memory, drivers, a communication section and so on, and operates by software. Feeder device 1, when set on pallet member 11, is connected to and communicates with control device 96 via connector 71 provided on a front surface of main body section 12. By this, control section 7 is able to receive required information from control device 96. Control section 7, via a driver, controls drive current of first motor 31 of rear side tape feeding mechanism 3, and second motor 41 of front side tape feeding mechanism 4. Also, control section 7, based on a detection result of a tape end detecting sensor, which is not shown, detects when the leading end surface 8T and the trailing end surface of component supply tape 8 pass the tape end detecting sensor.

4. Configuration and Attachment Method of Tape Peeling Mechanism 5

Figure 5:
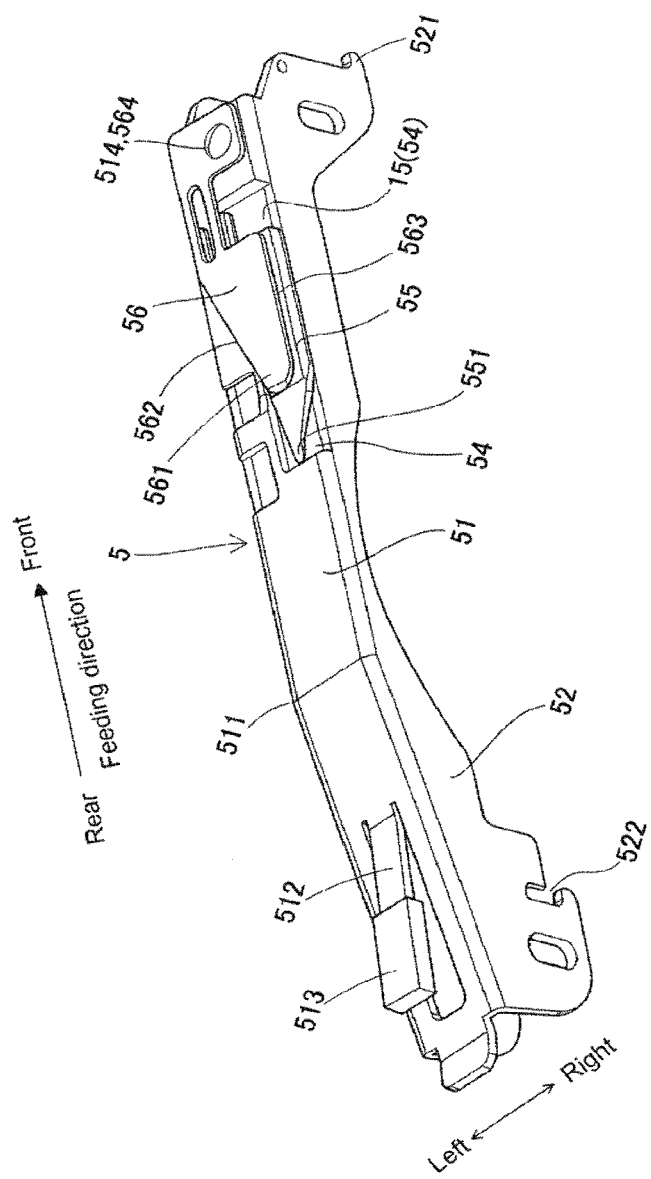
FIG. 5 is a perspective view of a tape peeling mechanism.

Tape peeling mechanism 5 is provided on an upper section towards the front of rail 2, that is, on an upper side of front tape feeding mechanism 4. FIG. 5 is a perspective view of tape peeling mechanism 5. Tape peeling mechanism 5 peels cover tape 81 of component supply tape 8 that is being fed from carrier tape 82 such that component P can be supplied from component storage section 831 of carrier tape 82 at component supply position 15. Multiple types of tape peeling mechanisms 5 are prepared in accordance with different types of component supply tape 8, and are exchangeably attached to feeder device 1.

As shown in FIG. 5, tape peeling mechanism 5 is formed with a C-shaped cross section open downwards including upper wall 51, right wall 52, and left wall 53, and is long in the feeding direction. Upper wall 51 is slightly bent at bending position 511 that is slightly further to the rear than a center point in the front-rear direction. Pressed section 512 is formed further to the rear than bending position 511 of upper wall 51. Pressed section 512 is formed at a cutout section of upper wall 51, and protrudes out upwards from upper wall 51 towards the rear. An end portion at the rear of pressed section 512 is covered by pressed member 513.

Front side engaging sections 521 and 531 that protrude forwards are each formed on a lower section at the front in the feeding direction of right wall 52 and left wall 53. Rear side engaging sections 522 and 532 are each formed on a lower section at the rear in the feeding direction of right wall 52 and left wall 53. Rear side engaging section 522 and 532 are formed with a hole elongated in a vertical direction and open at the front side. Front side engaging sections 521 and 531 and rear side engaging sections 522 and 532 for attaching tape peeling mechanism 5 to main body section 12.

Rectangular notch 54 is formed towards the front of upper wall 51 lengthwise in the front-rear direction and about half way on the right side in the width direction. Peeling member 55 is provided inside notch 54. Peeling member 55 has leading end section 551 that is thin in a vertical direction facing component supply tape 8 that is being fed. And, peeling member 55 is formed to get gradually thicker moving towards the rear (front of feeder device 1) from leading end section 551 (details described below).

Further, peeling member 55 has an inclined side surface that inclines from leading end section 551 towards the rear of the member. Therefore, the width dimension of peeling member 55 is small at leading end section 551 and gradually increases towards the rear of the member. Leading end section 551 of peeling method 55 is formed to be sharp, so as to favorably peel cover tape 81. A portion to the rear of peeling device 55 is formed with a fixed thickness and width and is fixed to right wall 52. In this vicinity, only a portion towards the center of notch 54 is open. The range of notch 54 towards the front among which peeling member 55 is not provided is set as component supply position 15.

Plate-shaped opening member 56 is provided on an upper section of peeling member 55 and upper wall 51. Opening member 56 is formed such that there is a slight gap with upper wall 51, and is fixed to left wall 53. Leading end 561 of opening member 56 that faces component supply tape 8 is arranged slightly rearwards of leading end section 551 of peeling member 55 (towards the front of feeder device 1). Leading end 561 of opening member 56 has a small width dimension and is within the width range of peeling member 55. The width dimension of opening member 56 gradually increases towards the rear of the member (front of feeder device 1). And, the left side surface of opening member 56 is inclined surface 562 inclined towards left wall 53, and the right side surface of opening member 56 is parallel surface 563 parallel with right wall 52. Left side inclined surface 562 protrudes to the left of peeling member 55 in the width direction at a position to the rear of opening member 56.

Note that, a feeder mark, not shown, representing a reference position is provided on a front upper section of main body section 12 of feeder device 1. Mark checking hole 564 is provided further forward than component supply position 15 of opening member 56 such that board camera 946 is able to image the feeder mark with tape peeling mechanism 5 attached. Similarly, mark checking hole 514 is provided at a corresponding position of upper wall 51.

Figure 6:
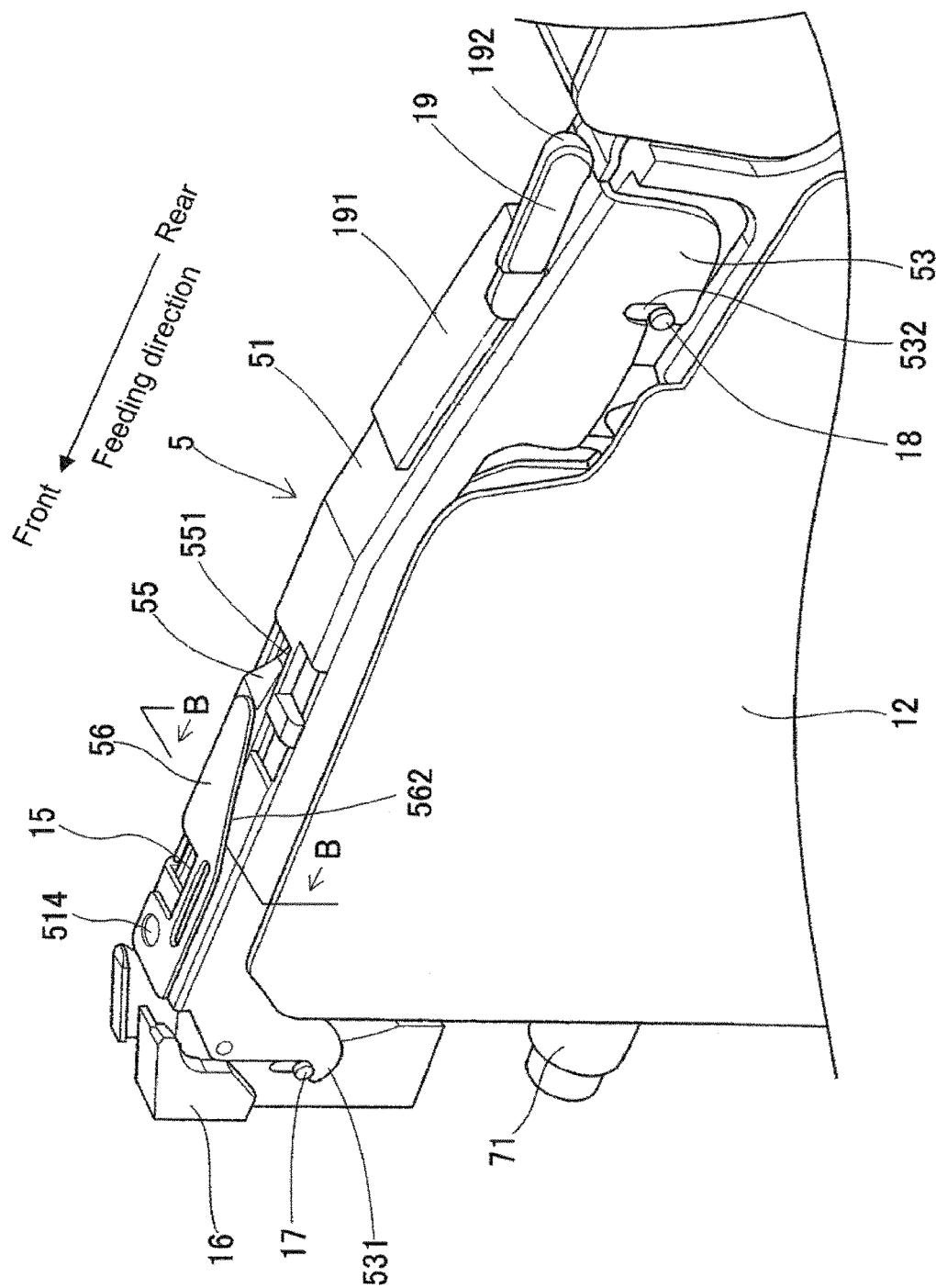
FIG. 6 is a perspective view from a different direction to FIG. 5 showing the tape peeling mechanism attached to a main body section.

FIG. 6 is a perspective view from a different direction to FIG. 5 showing tape peeling mechanism 5 attached to main body section 12. As shown, tape guide 16 is provided on an upper section of a front surface of main body section 12, and connector 71 is provided below tape guide 16. The width of a central portion of tape guide 16 is wider than the width of component supply tape 8, with the width of a constricted upper section being formed narrower than component supply tape 8. Tape guide 16 guides the feeding of component supply tape 8 that has completed supply of components P. Connector 71 plays the role of supplying power to feeder device 1, and connecting to and communicating with control device 7 and control device 96.

As shown in FIG. 6, front side attachment protruding section 17 is provided on both the left and right sides at the rear of tape guide 16 of main body section 12. Also, rear side attachment protruding section 18 is provided on both the left and right sides at a specified position of main body section 12 separated from front side attachment protruding section 17 by a distance slightly shorter than the overall length of tape peeling mechanism 5. Further, attaching lever 19 is provided on an upper diagonal rear section of rear side attachment protruding section 18 of main body section 12. Flat plate pressing member 191 is provided on a leading end of attaching lever 19. Attaching lever 19 is swingable around a center of shaft section 192, and is operated between a release state standing upright and an attachment state folded down forwards. And, pressing member 191 of attaching lever 19, in an attachment state shown in FIG. 6, is biased downwards by a biasing means that is not shown.

When tape peeling mechanism is attached to main body section 12, first, attaching lever 19 is upright in the release state. Then, front side engaging sections 521 and 531 of tape peeling mechanism 5 engage with a lower side of front side attachment protruding sections 17 of main body section 12, the overall body of tape peeling mechanism 5 is loaded on an upper side of main body section 12, and rear side attachment protruding section 18 is inserted into rear side engaging sections 522 and 532. Third, attaching lever 19 is folded down to the attachment state. By this, attachment operation is complete. For the reverse removal operation, attaching lever 19 is changed from the attachment state to the upright release state, and tape peeling mechanism 5 is removed upwards from main body section 12.

When tape peeling mechanism 5 is attached, pressing member 191 of attaching lever 19 presses pressed section 512 of peeling member 55. By this, tape peeling mechanism 5 is biased from above towards rail 2 in a vertically movable manner. Here, because component supply tape 8 being fed progresses between tape peeling mechanism 5 and rail 2, upper wall 51 of tape peeling mechanism 5 is biased from above towards component supply tape 8 and rail 2. And, leading end surface 8T of component supply tape 8 in the feeding direction, as shown in FIG. 7, faces leading end section 551 of peeling member 55.

Figure 7:
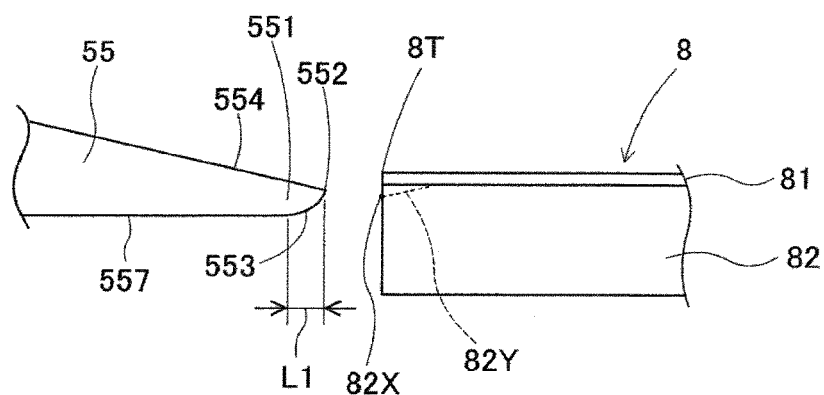
FIG. 7 is a side view showing a detailed shape of the leading end of a peeling member and its height relationship with the leading end of the component supply tape.

FIG. 7 is a side view showing a detailed shape of leading end section 551 of peeling member 55 and its height relationship with leading end surface 8T of component supply tape 8. As shown, leading end section 551 of peeling member 55 is formed including leading end upper edge 552 arranged below the height of the upper surface of carrier tape 82, and lower surface 553 that lowers heading rearwards from leading end upper edge 552. Lower surface 553 is rounded off at a position close to leading end upper edge 551 and is connected to lower surface 557 that is parallel to component supply tape 8. Length L1 of lower surface 553 in the feeding direction is formed to be shorter than distance D1 (refer to FIG. 9) between component storage section 831 at the head of component supply tape 8 and leading end surface 8T. On the other hand, upper surface 554 of leading end section 551 gradually rises towards the rear from leading end upper edge 552. Accordingly, peeling member 55 gets gradually thicker towards the rear.

The height relationship between tape peeling mechanism 5, component supply tape 8, and lane 2 is stabilized by tape peeling mechanism 5 being biased from above towards component supply tape 8 and rail 2. That is, when the height of peeling member 55 changes with respect to component supply tape 8, the height of the overall body of tape peeling mechanism 5 is automatically adjusted in the vertical direction by the elongated holes of rear side engaging section 522 and 532.

Figure 9:
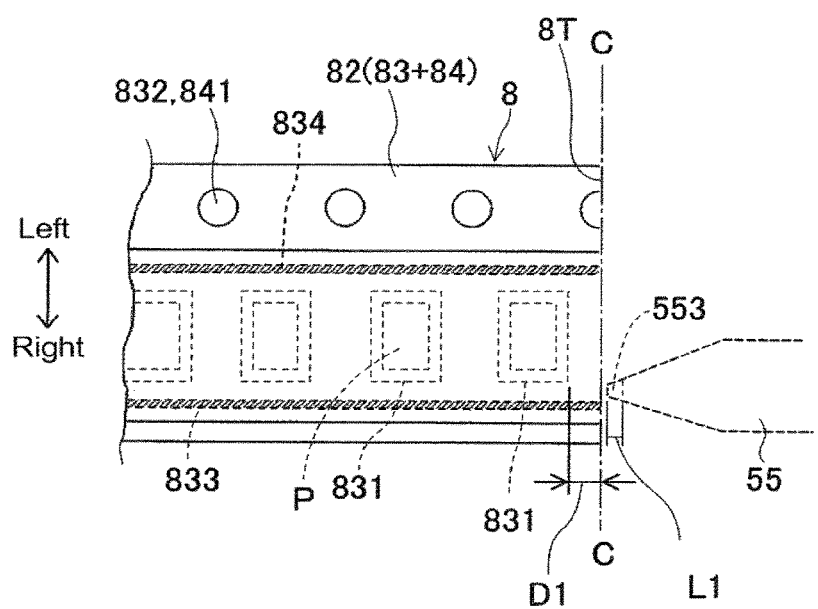
FIG. 9 is a plan view showing the positional relationship in the tape width direction of the peeling member and the component supply tape.

On the other hand, the positional relationship in the tape width direction of peeling member 55 and component supply tape 8 is shown in FIG. 9. FIG. 9 is a plan view showing the positional relationship in the tape width direction of peeling member 55 and component supply tape 8. With peeling member 55, leading end section 551 is arranged between left and right attachment sections 833 and 834 in the tape width direction, in detail, between right side attachment section 833 and component supply section 831. Also, peeling member 55 protrudes further to the outer side in the tape width direction than right side attachment section 833, and does not reach left side attachment section 834.

5. Effects of Feeder Device 1 of the Embodiment

Next, effects of feeder device 1 of the embodiment configured as above will be described. Supply reels 13 and 14 are set on feeder device 1, and when component supply tape 8 is fed, as shown in FIGS. 2 and 7, leading end surface 8T of component supply tape 8 faces leading end section 551 of peeling member 55. Then, when component supply tape 8 is fed further, leading end upper edge 552 of leading end section 551 of peeling member 55 first enters component supply tape 8. Here, as understood from the height relationship shown in FIG. 7, normally, leading end upper edge 552 progresses to position 82X that is lower than the upper edge of the leading end surface of carrier tape 82. Accordingly, there is no occurrence of a problem in which the overall body of component supply tape 8 goes under the lower side of peeling member 55.

For peeling member 55 that has entered at position 82X, because lower surface 553 of leading end section 551 inclines downwards towards the rear, component supply tape 8 gradually moves up as component supply tape 8 is fed. As a result, peeling member 55 naturally rides over carrier tape 82 via path 82Y, and settles between carrier tape 82 and cover tape 81. At this time, because length L1 of lower surface 553 is formed to be smaller than distance D1 of component supply tape 8, leading end section 551 of peeling member 55 is able to settle between carrier tape 82 and cover tape 81 before arriving at the leading end of component supply tape 8. Also, a progress mark remains on path 82Y of carrier tape 82 due to changes such as compression to the member or scraping off of just a portion of the member. Subsequently, peeling member 55 progresses between carrier tape 82 and cover tape 81 as component supply tape 8 is fed. By this, stable peeling is continued, and peeling member 55 cannot escape from tape 81 and 82.

Also, at leading end surface 8T of component supply tape 8, leading end upper edge 552 of leading end section 551 may progress directly between cover tape 81 and carrier tape 82. In this case, stable peeling from the start of insertion is continued.

Figure 8:
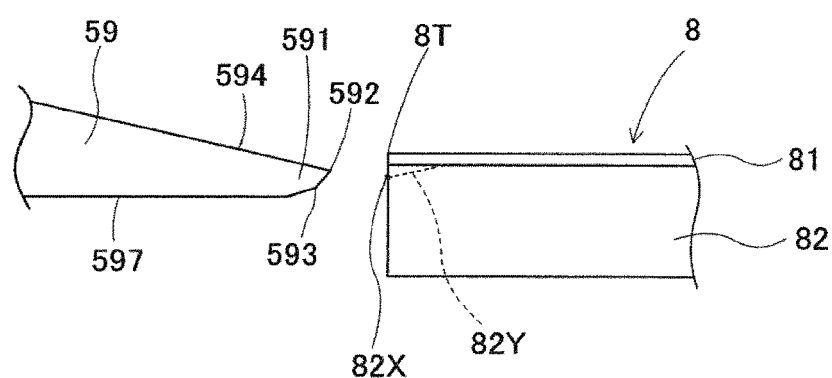
FIG. 8 is a side view showing the detailed shape the leading end section of a peeling member of an alternative embodiment.

Note that, leading end section 551 of peeling member 55 is not limited to the shape shown in FIG. 7, it may have the shape shown in FIG. 8 for example. FIG. 8 is a side view showing the detailed shape leading end section 591 of peeling member 59 an alternative embodiment. As shown, leading end section 591 of the alternative peeling member 55 is formed including leading end upper edge 592 arranged below the height of the upper surface of carrier tape 82, and lower surface 593 that lowers heading rearwards from leading end upper edge 592. Lower surface 593 is rounded off into two flat surfaces at a position close to leading end upper edge 592 and is connected to lower surface 597 that is parallel to component supply tape 8. On the other hand, upper surface 594 of leading end section 591 gradually rises towards the rear from leading end upper edge 592. Accordingly, peeling member 59 gets gradually thicker towards the rear. The effects during the insertion of component supply tape 8 when inserted into leading end surface 8T are the same for the alternative peeling member 59.

On the other hand, as shown in FIG. 9, leading end section 551 of peeling member 55 progresses between right side attachment section 833 of component supply tape 8 and component supply section 831. Peeling member 55 separates component supply tape 8 being fed from right side attachment section 833 but does not separate component supply tape 8 from left side attachment section 834. Further, component supply tape 8 is fed to opening member 56 that is further forward while maintaining a state peeled from right side attachment section 833 and attached to left side attachment section 834.

Figure 10:
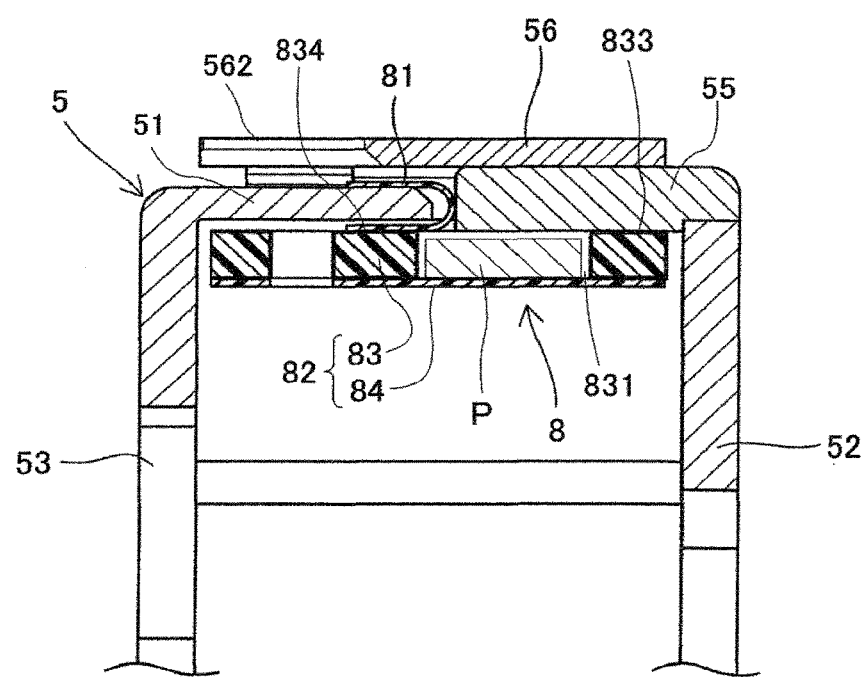
FIG. 10 is a cross section along the view B-B of FIG. 6 illustrating the component storage section of the component supply tape being opened by the opening member.

FIG. 10 is a cross section along the view B-B of FIG. 6 illustrating component storage section 831 of component supply tape 8 being opened by the opening member. Inclined surface 562 on the left side of opening member 56 receives fed component supply tape 8 and gradually imparts the following effects. That is, opening member 56 raises cover tape 81 peeled from right side attaching section 833 above left side attaching section 834 from which cover tape 81 is not peeled, folding over cover tape 81 to the left side. By this, the upper section of component storage section 831 is opened.

The upper section of component storage section 831 is maintained in an opened state including at component supply position 15 forward of where peeling member 55 ends, and component P is picked up by a suction nozzle. Further, at the forward tape guide 16, component supply tape 8 is fed with cover tape 81 folded back to the left. Subsequently, component supply tape 8 is collected with cover tape 81 attached to left side attachment section 834 of carrier tape 82.

6. Effects of Feeder Device 1 of Present Embodiment

Feeder device of the present embodiment includes: rear and front tape feeding mechanisms 3 and 4 configured to feed component supply tape 8 made from carrier tape 82 that stores components P respectively in many component storage sections 831 formed in a lengthwise direction of the tape and cover tape 81 attached to specified attachment sections 833 and 834 on an upper surface of carrier tape 82 that prevents the components P from falling from component storage sections 831; and tape peeling mechanism 5 provided with peeling member 55 configured to enter leading end surface 8T in a feeding direction of the fed component supply tape 8 so as to peel cover tape 81 from carrier tape 82 as component supply tape 8 is fed thereby enabling the component P to be supplied from component storage section 831 of carrier tape 82 at component supply position 15, wherein peeling member 55 is displaced upwards after entering the leading end surface of carrier tape 82 as component supply tape 8 is fed.

Accordingly, when component supply tape 8 is fed and leading end surface 8T arrives, peeling member 55 enters the leading end surface of the lower side carrier tape 82 of component supply tape 8. Therefore, a problem of the overall body of component supply tape 8 going under peeling member 55 does not occur. Also, peeling member 55, after entering the leading end surface of carrier tape 82, is displaced upwards as component supply tape 8 is fed, and naturally rises to the upper surface of carrier tape 82. Therefore, peeling member 55 settles between carrier tape 82 and cover tape 81 and components P in component storage sections 831 are not damaged. Further, because peeling member 55 subsequently progresses between carrier tape 82 and cover tape 81, cover tape 81 can be peeled reliably. Also, conventional work of making a notch in the cover tape near the leading end of component supply tape 8 and of peeling the cover tape in advance is not required.

Further, in feeder device 1 of the present application, peeling member 55 has leading end section 551 configured to enter the leading end surface of carrier tape 82 first, leading end section 551 being formed including leading end upper edge 552 arranged lower than an upper surface height of carrier tape 82 and lower surface 553 configured to lower heading rearwards from leading end upper edge 552. Accordingly, leading end upper edge 552 of peeling member 55 reliably and easily enters the leading end surface of carrier tape 82. Further, because lower surface 553 lowers heading rearwards, peeling member 55 is moved reliably upwards. Therefore, peeling member 55 moves smoothly from the first entering position to between carrier tape 82 and cover tape 81

Further, with feeder device 1 of the present embodiment, length L1 in the feeding direction of lower surface 553 of leading end section 551 of peeling member 55, is shorter than distance D1 between leading end surface 8T of carrier tape 82 and component storage section 831. Accordingly, leading end section 551 of peeling member 55 settles between carrier tape 82 and cover tape 81 before arriving at the leading end component supply section 831. Therefore, peeling device 55 is reliably prevented from damaging component P inside component storage section 831.

Further, in feeder device 1 of the present embodiment, peeling member 55, after entering at a position lower than an upper edge of the leading end surface of carrier tape 82, is displaced upwards while leaving an entry path in carrier tape 82 as component supply tape 8 is fed, and settles between carrier tape 82 and cover tape 81. Accordingly, because peeling member is displaced between carrier tape 82 and cover tape 81 from the initial entering position and subsequently settles between carrier tape 82 and cover tape 81, continues stable peeling.

Further, in feeder device 1 of the present embodiment, attachment sections 833 and 834 extending in a lengthwise direction of the tape are provided on each of the upper surfaces between left and right edges and component storage section 831 of carrier tape 82, and for peeling member 55, a width dimension in a tape width direction is small at leading end section 551 that enters the leading end surface of carrier tape 82 first and gradually increases towards the rear, and the leading end section is arranged between the left and right attachment sections in the tape width direction. Accordingly, leading end section 551 of peeling member 55 is positioned between left and right attachment sections 833 and 834, and tape is peeled from at least one of attachment sections 833 and 834, therefore peeling operation is more stable than a case in which leading end section 551 is arranged outside of attachment sections 833 and 834.

Further, in feeder device 1 of the present embodiment, peeling member 55 protrudes further to the outer side in the tape width direction than right side attachment section 833, and does not reach left side attachment section 834. Accordingly, because tape is not peeled from left side attachment section 834, cover tape 81 is collected in a state attached to carrier tape 82, and collecting work is reduced compared to a case in which cover tape 81 is completely peeled from carrier tape 82.

Further, in feeder device 1 of the present embodiment, tape peeling mechanism 5 includes opening member 56 configured to open component storage section 831 of carrier tape 82 by lifting up cover tape 81 peeled from right side attachment section 833 above left side attachment section 834 that is not peeled from, opening member 56 being provided forward of component supply position 15 in the feeding direction. Accordingly, component storage section 831 is opened automatically with a simple member.

Further, in feeder device of the present embodiment, tape peeling mechanism 5 is biased from above towards component supply tape 8. Accordingly, the relationship in the height direction of peeling member 55, component supply tape 8, and rail 2 is stabilized, therefore the height position of component supply tape 8 at which peeling member 55 enters, and displacement operation upwards, are stabilized.

7. Application of Present Embodiment and Alternative Embodiments

Note that, in the present embodiment, the height of the overall body of tape peeling mechanism 5 is automatically adjusted when peeling member 55 enters carrier tape 82 and is displaced upwards. For example, peeling member 55 may be formed using a plate spring, and leading end section 551 may be displaced upwards without the base of section of peeling member 55 moving. Also, peeling mechanism 55 of the present embodiment only peeled from right side attachment section 833, but the configuration is not limited to this. That is, the present application may be applied to a type of feeder device that peels from both left and right side attachment sections 833 and 834 and then collects cover tape 81 and carrier tape 82 separately. Further, the present application may be applied to a feeder device into which one component supply tape 8 is inserted, without providing next tape control mechanism 6. Various other applications and modifications are possible for the present application.

REFERENCE SIGNS LIST

1: feeder device; 12: main body section; 13, 14: supply reel; 15: component supply position; 2: rail; 3: rear side tape feeding mechanism; 4: front side tape feeding mechanism; 5: tape peeling mechanism; 51: upper wall; 52: right side wall; 53: left side wall; 54: notch; 55: peeling member; 551: leading end section; 552: leading end upper edge; 553: lower surface; 554: upper surface; 56: opening member; 562: inclined surface; 59: alternative peeling member; 6: next tape control mechanism; 7: control section; 8: component supply tape; 8T: leading end surface; 81: cover tape; 82: carrier tape; 83: base tape; 831, 831F: component storage section; 833, 834: attachment section; 84: bottom tape; 9: component mounter; 91: base; 92: board conveyance device; 94: component transfer device; 95: component camera; 96: control board; K: board; P: component

The invention claimed is:

1. A feeder device comprising:
a component supply tape including carrier tape that stores components respectively in many component storage sections formed in a lengthwise direction of the tape and including cover tape attached to a specified attachment surface on an upper surface of the carrier tape that prevents the components from falling from the component storage sections;
a tape feeding mechanism to feed the component supply tape; and
a tape peeling mechanism provided with a peeling member configured to enter a leading end surface in a feeding direction of the component supply tape so as to peel the cover tape from the carrier tape as the component supply tape is fed thereby enabling the components to be supplied from the component storage sections of the carrier tape at a component supply position, wherein
the peeling member is displaced upwards after entering the leading end surface of the carrier tape as the component supply tape is fed,
the peeling member includes a leading end section configured to enter the leading end surface of the carrier tape first,
the leading end section includes an upper surface ending at a leading end upper edge arranged lower than an upper surface height of the carrier tape, a lower surface parallel to the carrier tape, and a rounded surface that extends between the lower surface and the leading end upper edge, and
a length in the feeding direction of the curved surface of the leading end section of the peeling member is shorter than a distance between the leading end surface of the carrier tape and a leading component storage section in the feeding direction.

2. The feeder device according to claim 1, wherein
the peeling member, after entering at a position lower than an upper edge of the leading end surface of the carrier tape, is displaced upwards while leaving an entry path in the carrier tape as the component supply tape is fed, and settles between the carrier tape and the cover tape.

3. The feeder device according to claim 1, wherein
an attachment section extending in a lengthwise direction of the tape is provided on each of the upper surfaces between left and right edges and the component storage section of the carrier tape, and,
for the peeling member, a width dimension in a tape width direction is small at a leading end section that enters the leading end surface of the carrier tape first and gradually increases towards the rear, and the leading end section is arranged between the left and right attachment sections in the tape width direction.

4. The component mounter according to claim 3, wherein
the tape peeling mechanism includes an opening member configured to open the component storage section of the carrier tape by lifting up cover tape peeled from the one of the attachment sections above the other of the attachment sections that is not peeled from, the opening member being provided forward of the component supply position in the feeding direction.

5. The component mounter according to claim 4, wherein
one side of the opening member includes an inclined surface that folds the cover tape peeled from the one of the attachment sections toward and over the other of the attachment sections.

6. The component mounter according to claim 1, wherein
the tape peeling mechanism is biased towards the component supply tape from above in a vertically movable manner.

* * * * *